US 11,417,598 B2

United States Patent
Lin et al.

(10) Patent No.: US 11,417,598 B2
(45) Date of Patent: Aug. 16, 2022

(54) SEMICONDUCTOR PACKAGE AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Yenting Wen, Chandler, AZ (US); George Chang, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/853,073

(22) Filed: Apr. 20, 2020

(65) Prior Publication Data

US 2020/0251413 A1 Aug. 6, 2020

Related U.S. Application Data (63) Continuation of application No. 16/374,015, filed on Apr. 3, 2019, now Pat. No. 10,651,124, which is a continuation of application No. 15/973,904, filed on May 8, 2018, now Pat. No. 10,396,028, which is a
(Continued)

(51) Int. Cl.
*H01L 23/492* (2006.01)
*H01L 23/528* (2006.01)
*H01L 21/304* (2006.01)
*H01L 21/50* (2006.01)
*H01L 21/78* (2006.01)
*H01L 23/36* (2006.01)
(Continued)

(52) U.S. Cl.
CPC .......... *H01L 23/528* (2013.01); *H01L 21/304* (2013.01); *H01L 21/50* (2013.01); *H01L 21/78* (2013.01); *H01L 23/36* (2013.01); *H01L 23/492* (2013.01); *H01L 23/5228* (2013.01); *H01L 23/53228* (2013.01)

(58) Field of Classification Search
CPC ................ H01L 21/78; H01L 21/5228; H01L 23/53228; H01L 23/402; H01L 23/5228; H01L 23/492; H01L 23/36; H01L 23/528
See application file for complete search history.

(56) References Cited

U.S. PATENT DOCUMENTS

| 4,688,151 A | 8/1987 | Kraus et al. |
| 4,843,453 A | 6/1989 | Hooper et al. |
| 5,578,841 A | 11/1996 | Vasquez et al. |

(Continued)

OTHER PUBLICATIONS

"Laminate Data Sheet FCBGA," Amkor Techhnology, Inc., Sep. 2015, available at http://www.amkor.com/go/packaging/all-packages/superfc/superfc-super-flip-chip-fcbga-flip-chip-bga, last visted Jun. 29, 2016.

*Primary Examiner* — Caridad Everhart
(74) *Attorney, Agent, or Firm* — Adam R. Stephenson, Ltd.

(57) ABSTRACT

Implementations of semiconductor packages may include: a prefabricated electrically conductive section; two or more metal oxide semiconductor field effect transistors (MOSFET) physically coupled together; and a back metal coupled to the two or more MOSFETs; wherein the electrically conductive section may be coupled to the back metal and may be configured to electrically couple the two or more MOSFETs together during operation of the two or more MOSFETs.

20 Claims, 6 Drawing Sheets

Related U.S. Application Data continuation of application No. 15/198,799, filed on Jun. 30, 2016, now Pat. No. 9,984,968.

(51) Int. Cl.
 *H01L 23/522* (2006.01)
 *H01L 23/532* (2006.01)

(56) References Cited

U.S. PATENT DOCUMENTS

| | | |
|---|---|---|
| 6,104,062 A | 8/2000 | Zeng |
| 7,119,431 B1 | 10/2006 | Hopper et al. |
| 7,211,890 B2 | 5/2007 | Ramanathan et al. |
| 8,722,528 B2 | 5/2014 | Gruenhagen et al. |
| 8,987,820 B1 | 3/2015 | Lee et al. |
| 9,437,528 B1 | 9/2016 | Gong et al. |
| 2005/0156325 A1* | 7/2005 | You Yang ............... H01L 24/27 257/779 |
| 2006/0281315 A1* | 12/2006 | Burke ..................... H01L 24/27 438/689 |
| 2007/0096274 A1 | 5/2007 | Pavier et al. |
| 2007/0235886 A1* | 10/2007 | Yilmaz ............... H01L 23/3114 257/779 |
| 2007/0238263 A1 | 10/2007 | Yilmas et al. |
| 2009/0160045 A1 | 6/2009 | Sun et al. |
| 2009/0256196 A1* | 10/2009 | Wang ................ H01L 29/41741 257/334 |
| 2010/0059855 A1 | 3/2010 | Lin et al. |
| 2010/0301496 A1 | 12/2010 | Koduri |
| 2012/0205725 A1 | 8/2012 | Nygaard et al. |
| 2015/0069511 A1 | 3/2015 | Nygaard et al. |
| 2015/0115416 A1 | 4/2015 | Costa et al. |
| 2015/0179551 A1* | 6/2015 | Nakamura ............ H01L 23/481 257/773 |
| 2017/0069535 A1 | 3/2017 | Masuko |
| 2017/0186700 A1 | 6/2017 | Zhao |
| 2017/0263502 A1* | 9/2017 | Okita ..................... H01L 21/78 |
| 2017/0358510 A1* | 12/2017 | Park ...................... H01L 22/14 |
| 2019/0088550 A1* | 3/2019 | Ganitzer ................ H01L 24/05 |

\* cited by examiner

SEMICONDUCTOR PACKAGE AND RELATED METHODS

CROSS REFERENCE TO RELATED APPLICATIONS

This is a continuation application of the earlier U.S. Utility patent application to Yusheng Lin entitled "Semiconductor Package and Related Methods," application Ser. No. 16/374,015, filed Apr. 3, 2019, which is a continuation application of the earlier U.S. Utility patent application to Yusheng Lin entitled "Semiconductor Package and Related Methods," application Ser. No. 15/973,904, filed May 8, 2018, issued as U.S. Pat. No. 10,396,028 on Aug. 27, 2019; which is a continuation application of the earlier U.S. Utility patent application to Yusheng Lin entitled "Semiconductor Package and Related Methods," application Ser. No. 15/198,799, filed Jun. 30, 2016, issued at U.S. Pat. No. 9,984,968 on May 29, 2018, the disclosure of each of which are hereby incorporated entirely herein by reference.

BACKGROUND

1. Technical Field

Aspects of this document relate generally to semiconductor packages.

2. Background

Back metallization may be applied to a semiconductor die through evaporation or sputtering. Backside metallization often helps with solder attachment and application of heat transfer devices in semiconductor die packages.

SUMMARY

Implementations of semiconductor packages may include: a prefabricated electrically conductive section; two or more metal oxide semiconductor field effect transistors (MOSFET) physically coupled together; and a back metal coupled to the two or more MOSFETs; wherein the electrically conductive section may be coupled to the back metal and may be configured to electrically couple the two or more MOSFETs together during operation of the two or more MOSFETs.

Implementations of semiconductor packages may include one, all, or any of the following:

The on-resistance of the two or more MOSFETs may be reduced through the coupling of the electrically conductive section to the back metal.

The electrically conductive section may not be formed as part of the back metal during processing of the wafer.

The thickness of the electrically conductive section may be between 25 microns to 125 microns.

The electrically conductive section may include one of copper, aluminum, silver, gold, titanium, and any combination thereof.

The electrically conductive section may include copper.

The electrically conductive section may be coupled to the back metal using a silver sintering paste, solder, electrically conductive epoxy, or any combination thereof.

The back metal may include a titanium, nickel and silver alloy.

Implementations of semiconductor packages may be manufactured using a method for making semiconductor packages. The method may include: providing a wafer including a first side having a plurality of metal oxide semiconductor field effect transistors (MOSFETs); grinding a second side of the wafer to bring the wafer to a predetermined thickness between the first side and the second side; forming a back side metallization on the second side of the wafer; singulating the plurality of MOSFETs into one or more die that each include at least two MOSFETs; forming a plurality of semiconductor packages by coupling the one or more die to an electrically conductive section using an electrically conductive material, the electrically conductive section having a predetermined thickness; curing the electrically conductive material; and singulating the plurality of semiconductor packages by one of punching and stamping the electrically conductive section; wherein during operation of the die the at least two MOSFETs are electrically coupled through the electrically conductive section.

Implementations of methods of making semiconductor packages may include:

The method may further include reducing the on-resistance of the at least two MOSFETs through the coupling of the electrically conductive section to the back metal.

The electrically conductive section may be formed independently from the back metal during processing of the wafer.

The predetermined thickness of the electrically conductive section may be between 25 microns and 125 microns.

The electrically conductive section may include copper, aluminum, silver, gold, titanium, or any combination thereof.

The electrically conductive section may include copper.

The electrically conductive material may be a silver sintering paste, solder, electrically conductive epoxy, or any combination thereof.

The back metal may include a titanium, nickel, and silver alloy.

Implementations of semiconductor packages may be manufactured using a method for making a semiconductor package. The method may include: providing a sheet of electrically conductive material of a predetermined thickness; punching a plurality of electrically conductive sections from the sheet; providing a wafer having a plurality of MOSFETs on a first side of the wafer; thinning a thickness of the wafer; applying a back side metallization on a second side of the wafer; coupling a plurality of electrically conductive sections to a second side of the wafer, each electrically conductive section coupled to two or more of the plurality of MOSFETs; singulating each electrically conductive section and a two or more MOSFETs of the plurality of MOSFETs coupled thereto to form a plurality of semiconductor packages; and electrically coupling through the electrically conductive section the two or more MOSFETs during operation of each of the plurality of semiconductor packages.

Implementations of a method for making semiconductor packages may include:

The method may further include reducing the on-resistance of the two or more MOSFETs through the coupling of the electrically conductive section to the back metal.

The electrically conductive section may not be formed as part of the back metal during processing of the wafer.

The predetermined thickness of the electrically conductive section may be between 25 microns and 125 microns.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
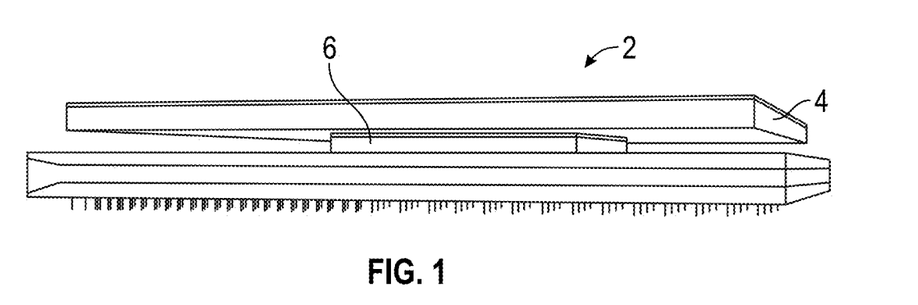
FIG. 1 is a front view of a metal lid attached to a die for thermal dissipation.

Referring to FIG. 1, a device 2 with a metal lid 4 used to transfer heat away from a silicon die 6 is illustrated. The metal lid 4 acts as a heat slug that draws heat via conduction away from the silicon die 6. The metal lid 4 may be coated with electrically insulating material so that users may not contact an electrically live component, posing safety risks, once the package is installed on a motherboard.

Figure 2:
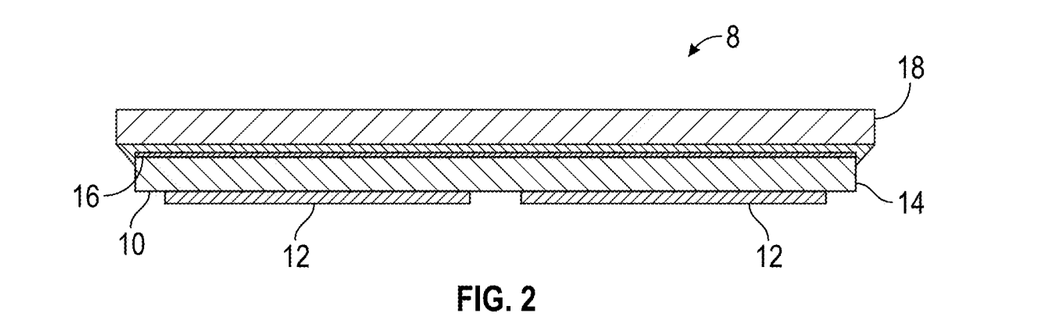
FIG. 2 is a front view of an implementation of semiconductor package having a pair of metal oxide semiconductor field effect transistors (MOSFET) coupled to a copper frame.

Referring to FIG. 2, an implementation of a semiconductor package 8 like those disclosed herein is illustrated. In this implementation, a die 10 including two or more metal oxide semiconductor field effect transistors (MOSFET) 12 on a silicon wafer 14 is electrically coupled to a copper frame 18 acting as an electrically conductive section. The die 10 has a back metallization 16 between the silicon wafer 14 and the copper frame 18. One of the basic and novel characteristics of the semiconductor packages in this disclosure is that the electrically conductive section completes a circuit between the MOSFETs and so participates electrically during the operation of the MOSFETs. In this way, the electrically conductive section 18 does not exist merely to conduct heat away from the MOSFETs.

As a result of the electrically conductive section electrically connecting the MOSFETs together, the electrically conductive section 18 acts to lower the on-resistance of the MOSFETs 12/die 10. The electrically conductive section 18 is a separate, pre-fabricated piece of electrically conductive material that is coupled to the die 10 after the back metallization 16 has been formed on the die 10. The back metallization 16 may include any number of alloys, including by non-limiting example, titanium, nickel, and silver; titanium, nickel, vanadium, gold; titanium, nickel, copper, gold; or any previously mentioned element alone, or in any possible combination with the other elements along with other electrically conductive elements. It may be evaporated or sputtered onto the back of the silicon wafer before adding the electrically conductive section. The electrically conductive section 18 may also include, by non-limiting example, copper, aluminum, silver, gold, titanium, any combination thereof or any other suitable material known in the art. The on-resistance of the semiconductor package 8 is decreased when the thickness of electrically conductive section 18 increases. The most significant rate of improvement is observed where the thickness is between about 20 to about 75 microns, and the effect of improvement substantially levels out at a thickness of about 200 microns and above. In various implementations, the thickness of the electrically conductive section 18 is between about 25 microns to about 125 microns thick. In various implementations, the thickness may be between about 125 microns to about 200 microns.

Figure 3A:
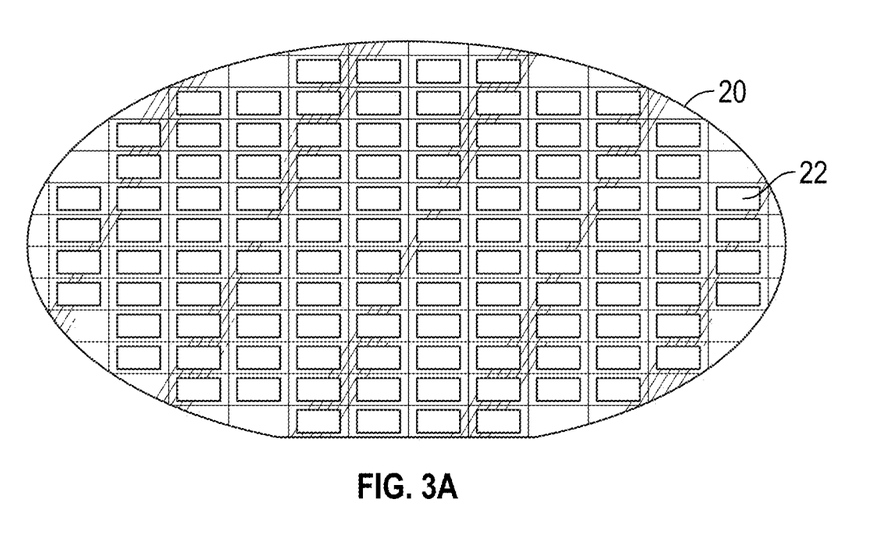
FIGS. 3A-3D illustrate an implementation of a method of making the implementation of a semiconductor package as shown in FIG. 2.
Figure 3B:
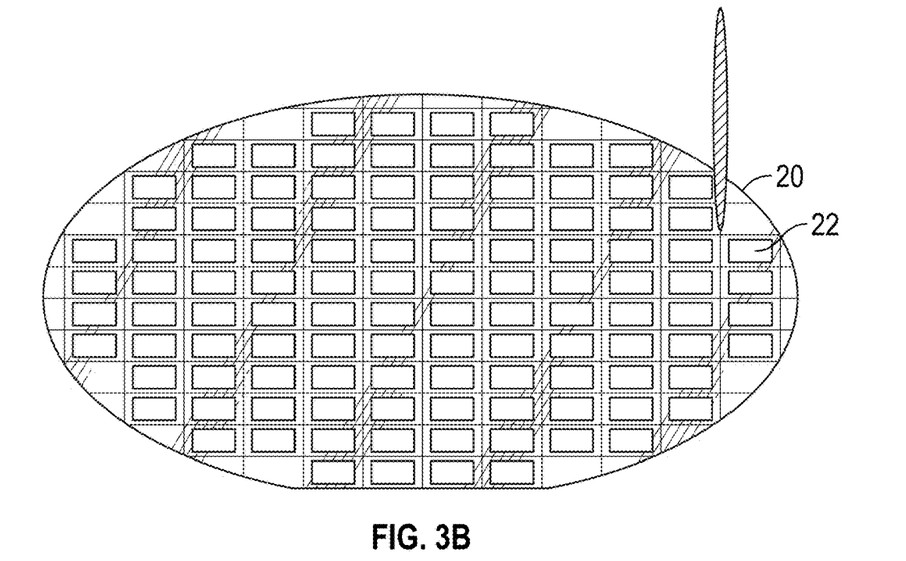
Figure 3C:
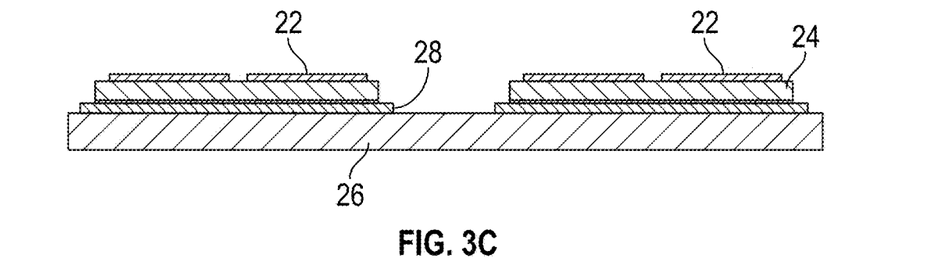
Figure 3D:
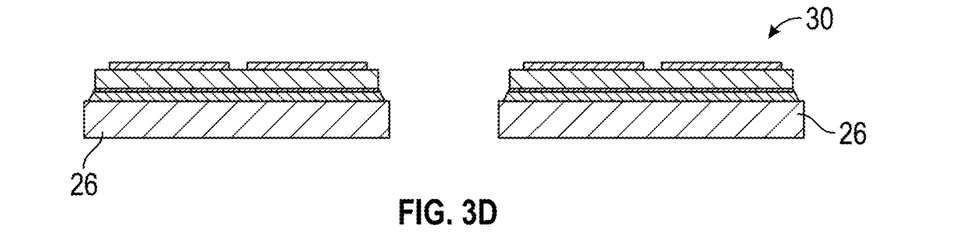

Referring to FIGS. 3A-3D, an implementation of a method for making a semiconductor package is illustrated. In FIG. 3A, a wafer 20 is provided. The wafer 20 has a first side having a plurality of die containing MOSFETs 22. A second side of the wafer 20 is ground down to bring the wafer 20 to a predetermined thickness. The on-resistance of the MOSFETs 22 may decrease when the wafer itself is thinned between about 25 to about 125 microns thick. In FIG. 3B, the wafer 20 is singulated into one or more die 24 that each have at least two MOSFETs 22. In FIG. 3C, a plurality of semiconductor packages 30 are formed when the one or more die 24 are coupled to an electrically conduction section 26 using an electrically conductive material 28. The electrically conductive material 28 may then be cured. The electrically conductive section 26 may have a predetermined thickness between about 25 to about 120 microns. In various implementations, the thickness may be between about 120 microns to about 200 microns. The electrically conductive material 28 may include, by non-limiting example, a silver sintering paste, solder, electrically conductive epoxy, any combination thereof, or any other suitable material known in the art. In FIG. 3D, the plurality of semiconductor packages are singulated by various methods, including, by non-limiting example, punching, stamping, sawing, or laser cutting the copper frame.

Figure 4:
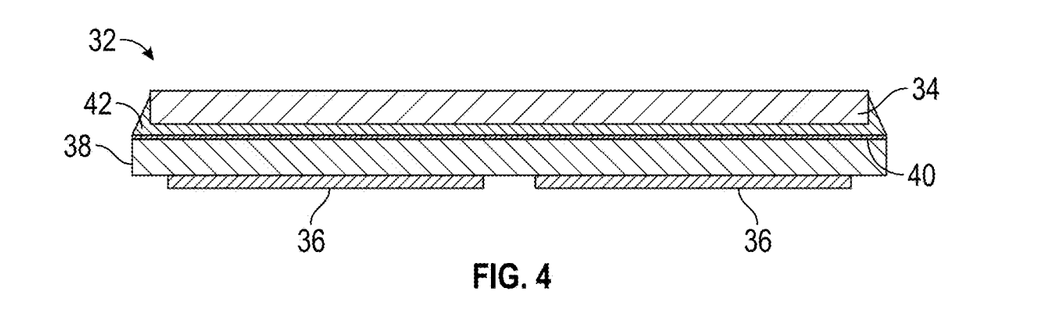
FIG. 4 is a front view of an implementation of a semiconductor package having a copper frame coupled to a pair of MOSFETs.

Referring now to FIG. 4, an implementation of a semiconductor package 32 having a copper frame 34 coupled to two or more MOSFETs 36 is illustrated. Two or more MOSFETs are physically coupled together on semiconductor die 38. A back metal 40 is coupled to the two of more MOSFETS 36. A prefabricated, electrically conductive section 34 is coupled to the back metal 40 and is configured to electrically couple the two or more MOSFETs 36 together during operation of the two or more MOSFETs. The electrically conductive section 34 may be coupled to the back metal through a silver sintering paste 42, soldering paste or any another suitable material known in the art disclosed herein. The electrically conductive section may also have any thickness disclosed herein.

Figure 5A:
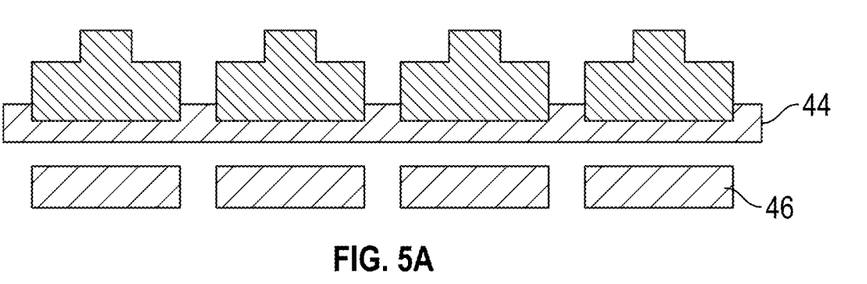
FIGS. 5A-5D illustrate an implementation of a method of making a semiconductor package as show in FIG. 4.
Figure 5B:
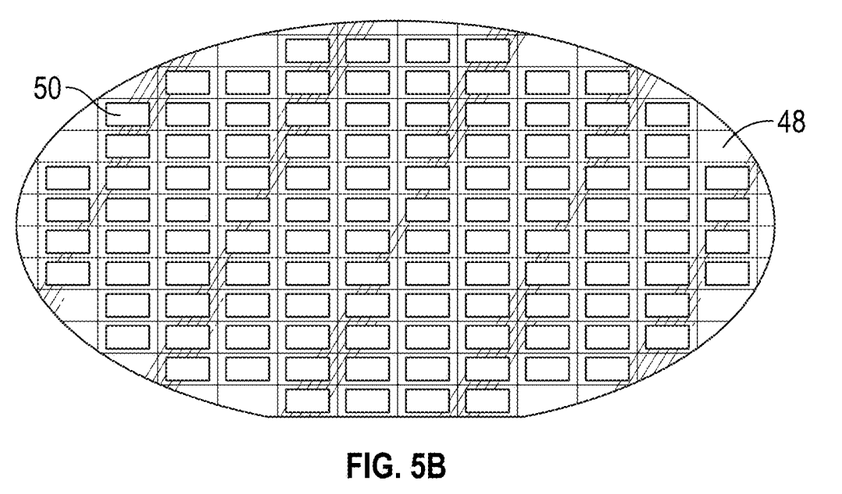
Figure 5C:
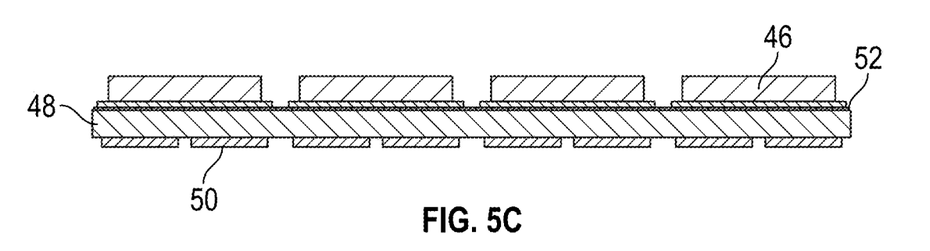
Figure 5D:
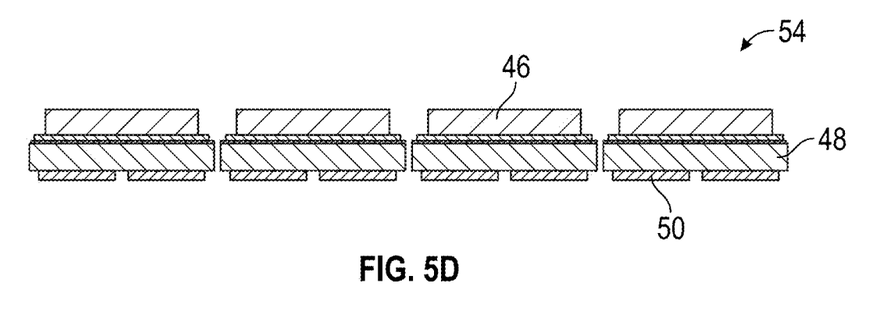

Referring to FIGS. 5A-5D, an implementation of a method for making an implementation of a semiconductor package is illustrated. In FIG. 5A, a sheet of electrically conductive material 44 is provided. The electrically conductive material is a predetermined thickness between about 25 microns and about 125 microns. In various implementations, the thickness can be between about 125 microns to about 200 microns. A plurality of electrically conductive sections 46 are punched from the sheet 44. In FIG. 5B, a semiconductor wafer 48 having a plurality of MOSFETs 50 on a first side of the wafer is provided and thinned to a predetermined thickness. A back side metallization 52 is then applied on a second side of the wafer 48. In FIG. 5C, a plurality of electrically conductive sections 46 are coupled to a second side of the wafer to a location corresponding with the location of each die on the wafer. The electrically conductive sections 46 may be coupled to the plurality of die by a pick and place method. Each electrically conductive section 46 is coupled to two or more of the plurality of MOSFETs 50. In FIG. 5D, the wafer 48 is singulated, forming a plurality of semiconductor packages 54 each having an electrically conductive section coupled to two or more MOSFETs 50. The two or more MOSFETs 50 are then electrically coupled during operation of the semiconductor packages 54 through the electrically conductive section 46.

Figure 6A:
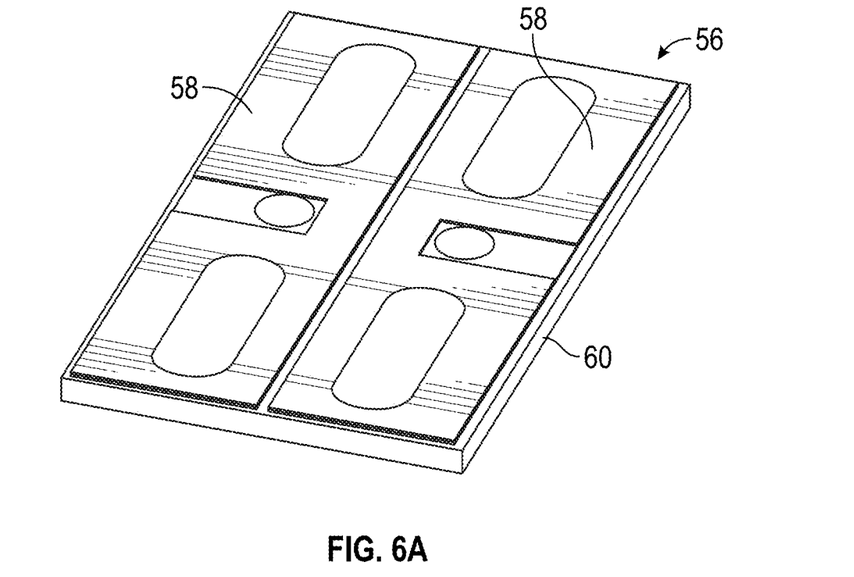
FIGS. 6A-6C illustrates the resistance in a conventional MOSFET semiconductor package.
Figure 6B:
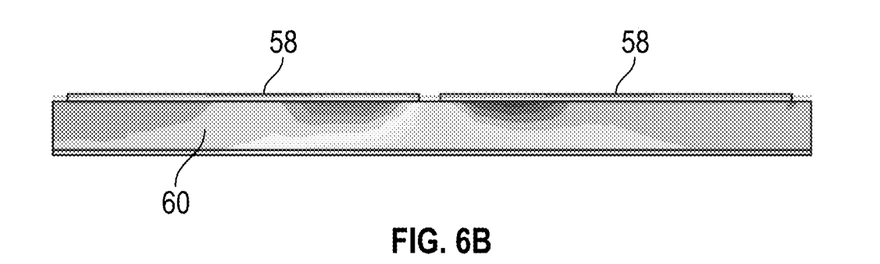
Figure 6C:
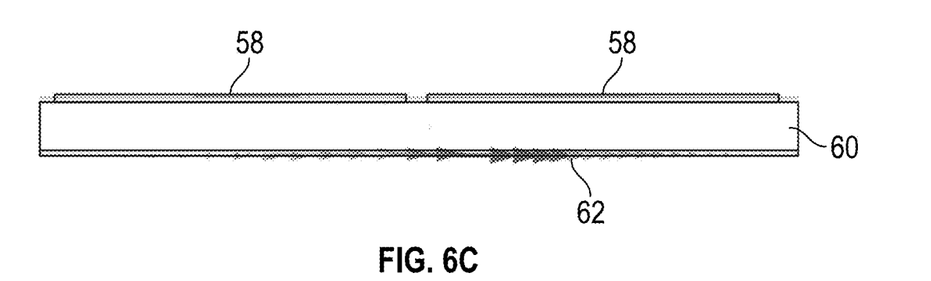

Referring to FIG. 6A-6C, the results of a case study of a conventional MOSFET semiconductor package 56 is illustrated. In FIG. 6A, two MOSFETs 58 are mounted on silicon 60 with a conventional back metal including copper. The semiconductor package 56 has a die size of 1.81 mm by 3.09 mm and a scribe line of 60 microns. In FIG. 6B, the voltage distribution of 3.8V across the silicon is illustrated. In FIG. 6C, the current distribution 62 across the back of the silicon 60 is illustrated. There are two possible solutions to lower the resistance of the semiconductor package as seen in FIGS. 6A-6C.

The resistance of a semiconductor may be lowered by decreasing the thickness of the semiconductor material, in this case silicon, and/or by increasing the thickness of the back metallization. Other semiconductor materials may also be used for the wafer material itself, such as, by non-limiting example, silicon germanium (SiGe). When the silicon layer is thinned the die becomes more susceptible to warpage if the back metallization is increased due to tensile or compressive forces caused by the metal layer being applied through evaporation or sputtering. Since the tensile or compressive forces increase in proportion to the thickness of the backside metal layer, where the die becomes thin, increasing the backside metal layer thickness beyond a critical thickness becomes impossible. This critical thickness is thinner than that backside metal layer thickness possible on full thickness wafers because the full thickness wafer has greater resistance to the tensile or compressive forces imposed by the backside metal layer.

Figure 7A:
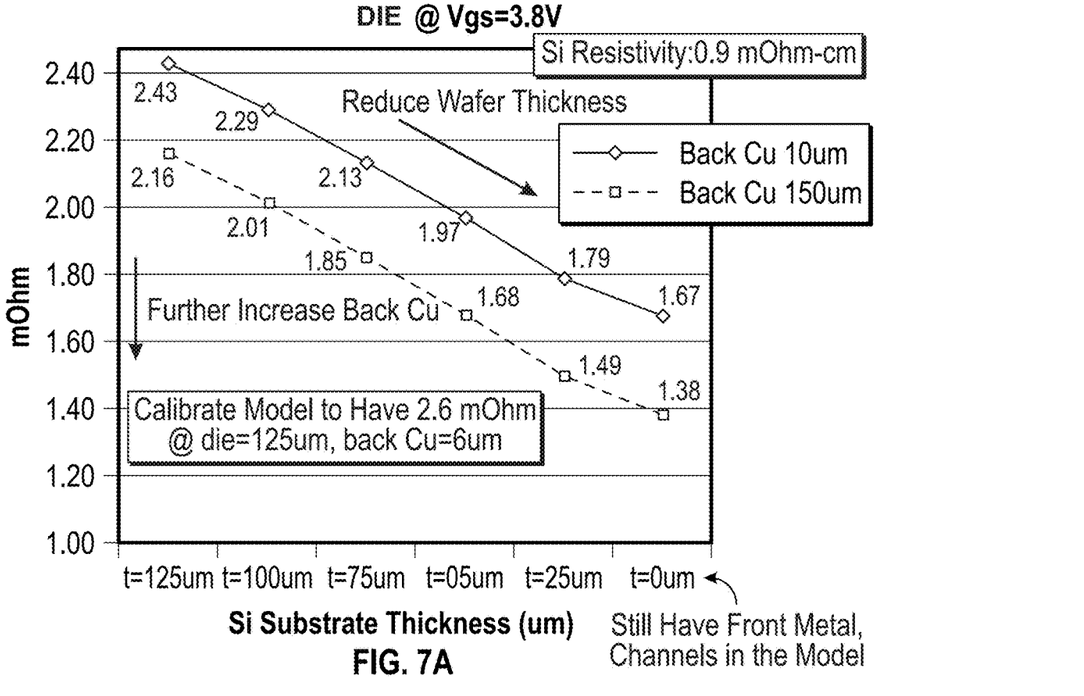
FIGS. 7A-7B are graphs illustrating the possible decreases in on-resistance of implementations of semiconductor packages.
Figure 7B:
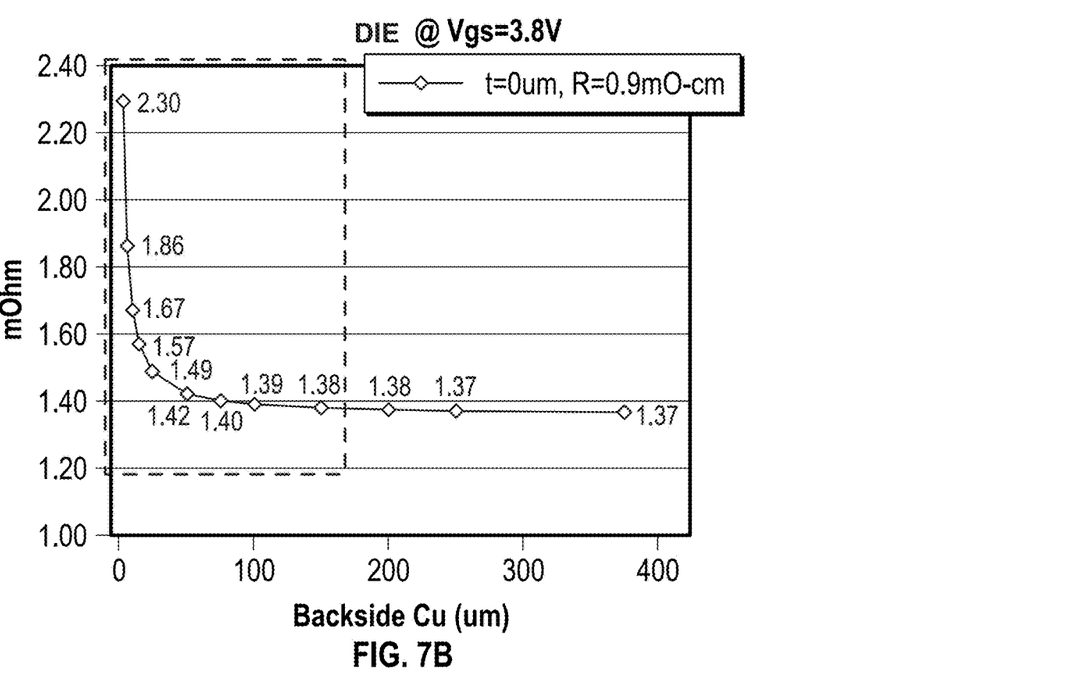
Figure 8A:
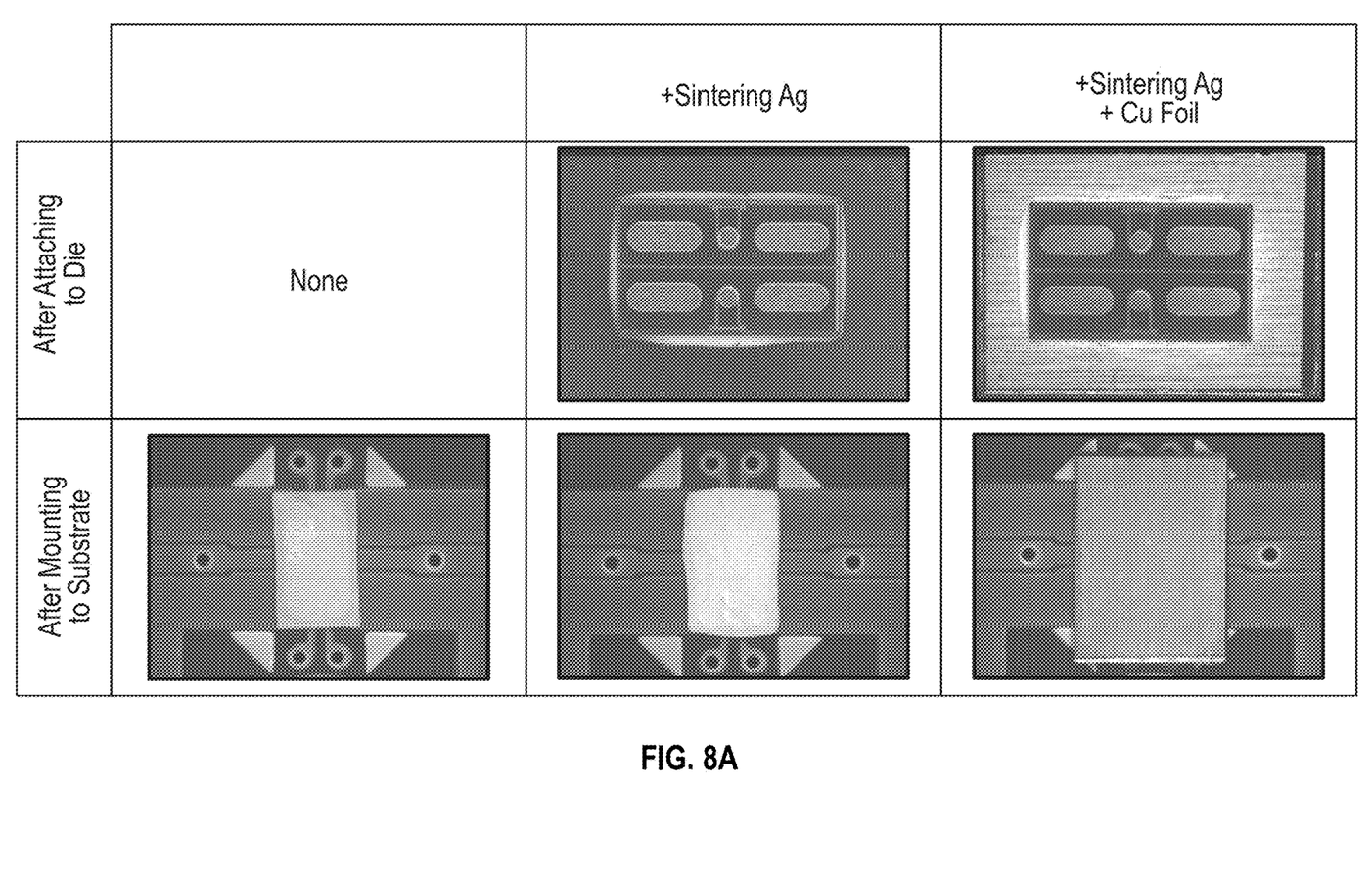
FIG. 8A illustrates the parameters and results of a feasibility study for implementations of a semiconductor package.

Referring to FIGS. 7A-7, graphs of models showing possible reductions in the resistance of semiconductor packages are illustrated. This model uses the die illustrated in FIG. 6A as the base for reducing the wafer thickness and adding a copper thickness. In FIG. 7A, the results for decreasing the thickness of the silicon wafer are illustrated. The two models start with a silicon thickness of 125 microns and decrease to a silicon thickness of 0 microns. The top, solid line shows a die having a 10 micron thick copper layer added to the die. The bottom, dotted line shows a die having a hypothetical 150 micron thick copper layer added to the die. There is approximately a 13% decrease in resistivity when the thickness of the copper section is increased.

In FIG. 7B, the resistivity is projected as the thickness of the copper section is increased while the silicon thickness is held constant at a hypothetical 0 microns. This graphs shows that the resistivity of a device approaches a constant of approximately 1.38 mOhms once the copper is about 150 microns thick. In this model, the reduction in resistivity is greater than 30%.

Referring now to the Table 1 below, the results of an experiment using implementations of semiconductor packages as described in this disclosure are illustrated. In the left hand column, the thickness of the silicon is listed. All the die have a back metallization of Ti/Ni/Ag with thicknesses of 500 Å/500 Å/1000 Å, respectively. In the top row the presence and thickness of a copper section/frame is listed. The copper section is coupled to the die through silver sintering paste. As predicted by the feasibility study, the lowest on resistance is achieved with a copper section thickness of 125 microns and a silicon thickness of 50 microns.

TABLE 1

| Silicon Thickness | No Frame (Original structure) | 80 μm Copper | 125 μm Copper |
|---|---|---|---|
| 125 μm thick silicon | RSSon result: 6.98 mΩ/3.8 V | RSSon result: 2.45 mΩ/3.8 V | RSSon result: 2.42 mΩ/3.8 V |
| 90 μm thick silicon | RSSon result: 7.45 mΩ/3.8 V | RSSon result: 2.23 mΩ/3.8 V | RSSon result: 2.18 mΩ/3.8 V |
| 50 μm thick silicon | RSSon result: 8.43 mΩ/3.8 V | RSSon result: 1.86 mΩ/3.8 V | RSSon result: 1.82 mΩ/3.8 V |

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a prefabricated copper slab;
   two or more metal oxide semiconductor field effect transistors (MOSFET) comprised in a same semiconductor die; and
   a back metal coupled to the two or more MOSFETs;
   wherein the prefabricated copper slab is coupled directly to the back metal and is configured to electrically couple the two or more MOSFETs together during operation of the two or more MOSFETs; and
   wherein the prefabricated copper slab comprises an outer perimeter that is smaller than an outer perimeter of the same semiconductor die.

2. The semiconductor package of claim 1, wherein an on-resistance of the two or more MOSFETs is reduced through the coupling of the prefabricated copper slab to the back metal.

3. The semiconductor package of claim 1, wherein the prefabricated copper slab is not formed as part of the back metal during processing.

4. The semiconductor package of claim 1, wherein a thickness of the prefabricated copper slab is between 25 microns to 125 microns.

5. The semiconductor package of claim 1, wherein a thickness of the prefabricated copper slab is between 120 microns to 200 microns.

6. The semiconductor package of claim 1, wherein the prefabricated copper slab is coupled to the back metal using one of a silver sintering paste, solder, electrically conductive epoxy, and any combination thereof.

7. The semiconductor package of claim 1, wherein the back metal comprises a titanium, nickel and silver alloy.

8. A semiconductor package comprising:
a prefabricated copper section;
two or more metal oxide semiconductor field effect transistors (MOSFET) comprised in a same semiconductor die; and
a back metal coupled to the two or more MOSFETs;
wherein the prefabricated copper section is coupled directly to the back metal and is configured to electrically couple the two or more MOSFETs together during operation of the two or more MOSFETs; and
wherein the prefabricated copper section comprises an outer perimeter that is smaller than an outer perimeter of the back metal.

9. The semiconductor package of claim 8, wherein an on-resistance of the two or more MOSFETs is reduced through the coupling of the prefabricated copper section to the back metal.

10. The semiconductor package of claim 8, wherein the prefabricated copper section is not formed as part of the back metal during processing.

11. The semiconductor package of claim 8, wherein a thickness of the prefabricated copper section is between 25 microns to 125 microns.

12. The semiconductor package of claim 8, wherein a thickness of the prefabricated copper section is between 120 microns to 200 microns.

13. The semiconductor package of claim 8, wherein the prefabricated copper section is coupled to the back metal using one of a silver sintering paste, solder, electrically conductive epoxy, and any combination thereof.

14. The semiconductor package of claim 8, wherein the back metal comprises a titanium, nickel and silver alloy.

15. A semiconductor package comprising:
one of a prefabricated aluminum slab or a prefabricated aluminum section;
two or more metal oxide semiconductor field effect transistors (MOSFET) comprised in a same semiconductor die; and
a back metal coupled to the two or more MOSFETs;
wherein the one of the prefabricated aluminum slab or the prefabricated aluminum section is coupled directly to the back metal and is configured to electrically couple the two or more MOSFETs together during operation of the two or more MOSFETs; and
wherein the one of the prefabricated aluminum slab or the prefabricated aluminum section comprises an outer perimeter that is smaller than an outer perimeter of the same semiconductor die.

16. The semiconductor package of claim 15, wherein an on-resistance of the two or more MOSFETs is reduced through the coupling of one of the prefabricated aluminum slab or the prefabricated aluminum section to the back metal.

17. The semiconductor package of claim 15, wherein a thickness of the one of the prefabricated aluminum slab or the prefabricated aluminum section is between 25 microns to 125 microns.

18. The semiconductor package of claim 15, wherein a thickness of the one of the prefabricated aluminum slab or the prefabricated aluminum section is between 120 microns to 200 microns.

19. The semiconductor package of claim 15, wherein the one of the prefabricated aluminum slab or the prefabricated aluminum section is coupled to the back metal using one of a silver sintering paste, solder, electrically conductive epoxy, and any combination thereof.

20. The semiconductor package of claim 15, wherein the back metal comprises a titanium, nickel and silver alloy.

* * * * *